United States Patent [19]

Jastrzebski et al.

[11] 4,348,690

[45] Sep. 7, 1982

[54] SEMICONDUCTOR IMAGERS

[75] Inventors: Lubomir L. Jastrzebski, Plainsboro; Peter A. Levine, Trenton, both of N.J.

[73] Assignee: RCA Corporation, New York, N.Y.

[21] Appl. No.: 259,360

[22] Filed: Apr. 30, 1981

[51] Int. Cl.³ .................. H04N 3/14; H04N 9/07
[52] U.S. Cl. ................................ 358/44; 357/24; 358/213
[58] Field of Search .......... 357/30, 32, 45, 24; 250/211 J, 211 R; 358/41, 44, 212, 213

[56] References Cited

U.S. PATENT DOCUMENTS

| 3,703,669 | 11/1972 | London | 317/235 R |
|---|---|---|---|
| 3,796,932 | 3/1974 | Amelio et al. | 317/235 R |
| 3,796,933 | 3/1974 | Arnett et al. | 317/235 R |
| 3,829,884 | 8/1974 | Borel et al. | 357/24 |
| 3,838,438 | 9/1974 | Silversmith et al. | 357/24 |
| 3,906,542 | 9/1975 | Krambeck et al. | 357/24 |
| 3,913,122 | 10/1975 | Borel et al. | 357/24 |
| 3,936,861 | 2/1976 | Borel et al. | 357/24 |
| 4,126,794 | 11/1978 | Tompsett | 357/24 X |
| 4,132,903 | 1/1979 | Graham | 357/24 X |

Primary Examiner—Robert L. Richardson
Attorney, Agent, or Firm—Samuel Cohen; Robert L. Troike; Allen LeRoy Limberg

[57] ABSTRACT

A gradient in the impurity concentration of the semiconductor material in a CCD imager, normal to the surface in which the charge-accumulation wells are induced, speeds the collection of charge carriers formed further from the surface by photon interaction with the semiconductor lattice. This reduces the chance for crosstalk between charge-accumulation wells owing to sideways diffusion.

9 Claims, 4 Drawing Figures

SEMICONDUCTOR IMAGERS

The present application deals with semiconductor imagers—e.g., with charge-coupled-device (CCD) imagers.

A semiconductor imager is used as a transducer for converting energy descriptive of an image—e.g. an electron beam or radiant energy—into electrical signals. Such an imager may be used for converting light images into electrical signals in a television camera, for example. Of particular interest in this last regard are CCD imagers that generate electrical signals from which color images can be reconstructed. These imagers conventionally employ a subtractive color-discriminating filter passing different colors in a pattern (e.g. of striped or checkerboard nature) to fall on a photosensitive portion of the CCD. If the filter is a striped one, the stripes are oriented perpendicularly to the direction of rapid scanning of the picture. That is, where the image is scanned rapidly from left to right and slowly from top to bottom, the color filter stripes are vertical for normal camera position. The photosensitive register of the CCD located behind the striped filter is divided into columns by so-called "channel stops."

The CCD device includes a region of semiconductive material, a plane surface of which is overlaid with a dielectric layer, such as an oxide layer grown on the surface. Conductive electrodes (e.g. of metal or polycrystalline silicon) are disposed on the side of the dielectric layer opposite the plane surface of the region; and charge packets are moved from one location to another in the semiconductive material by electric fields induced in that material by the application of suitable potentials to the electrodes. Channel stops are portions of the region of semiconductive material near its plane surface into which an impurity, or dopant, has been introduced of such nature as to cause an internal field near that surface presenting a potential barrier across which charge carriers (i.e., electrons or holes, as the case may be) are unlikely to flow.

In a radiant-energy-responsive CCD imager, charge carriers are generated as hole-electron pairs in the semiconductive material by photoelectric conversion of the photons in the image projected into the substrate. The image may be projected into the substrate through its front surface—i.e. the plane surface which the insulating layer overlays. In such case, the electrodes should not impede the projection of the radiant energy image into the semiconductor region; so they must be suitably narrow and widely spaced, or made of material substantially transparent to the radiant energy, or both. Alternatively, the semiconductor region can be made suitably thin (10 microns or so) between its front surface and an opposing back surface, in which case the radiant energy can be projected into the back surface, allowing the use of closely spaced electrodes of material not transparent to the radiant energy image. It is desirable for best display resolution to collect the charge carriers during an integration time in the potential wells closest to the charge carrier generation sites. More specifically, a charge carrier should be collected by the potential well that is induced by the electrode through which passes the normal from the charge generation site to the front surface of the semiconductor region. The sites in the semiconductor region where charge carriers are generated can be further from the front surface of the region than the potential wells extend.

This gives rise to the problem which the present invention alleviates. The drift or diffusion of the charge carriers through the crystalline lattice of the semiconductor material before their collection in the potential wells under the CCD electrodes would, absent an accelerating electrostatic field, be random in direction. Such a field for accelerating the charge carriers exists in the potential wells induced under the electrodes in the region of semiconductive material, but the field strength falls off further into the semiconductive material from the dielectric layer and the electrodes inducing the potential wells. In these regions remote from the front surface of the imager, a charge carrier that properly should be collected in the well associated with one electrode may drift sideways, roughly parallel to the front surface to be collected in a well associated with a different electrode. This phenomenon will, of course, reduce the resolution of a CCD imager, whether it reproduces only gray scale or color. But, in a color CCD imager where the errant charge carrier can be collected by a potential well associated with a different primary color response than that associated with the potential well that should collect it, there is a loss of color purity which the eye tends to be less tolerant of than the loss of resolution.

In a CCD imager or the like which embodies the present invention there is provided a means for continuously applying an internal field gradient within the region of semiconductive material of a sort tending to accelerate the charge carriers towards the front surface. This moves the charge carriers to the front surface in lessened time, so they are more quickly drawn into confinement within a potential well and so have a substantially lessened opportunity for sideways drift, as would allow them to be collected by an electrode other than the one they are supposed to be collected by. A preferred way to establish the continuously applied accelerating field is by introducing a gradient into the doping of the semiconductive material perpendicular to the front surface.

Figure 3:
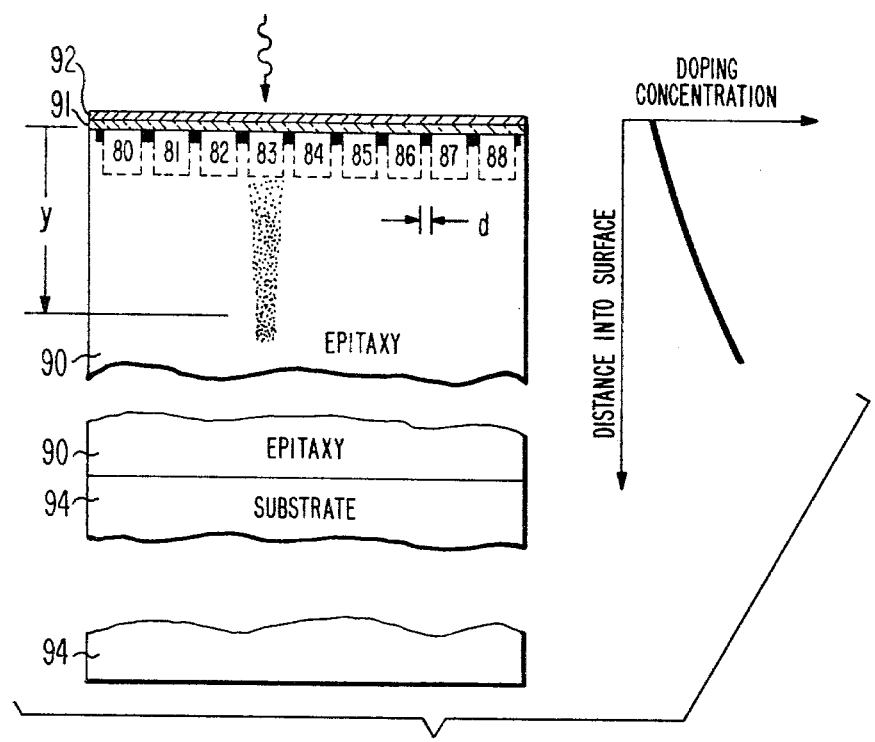
Figure 4:
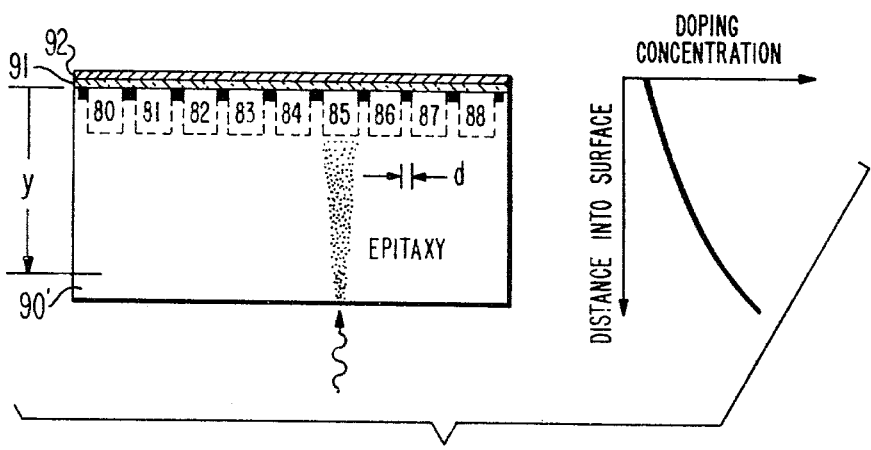

FIG. 3 is a section view of the CCD imager of the type illuminated from the front surface, with exaggeration of the vertical scale, useful in understanding the present invention, with a diagram of dopant concentration drawn to corresponding vertical scale juxtaposed therebeside; and FIG. 4 is a section view of the CCD imager of the type illuminated from the back surface, with juxtaposed diagram of dopant concentration drawn to corresponding vertical scale.

Figure 1:
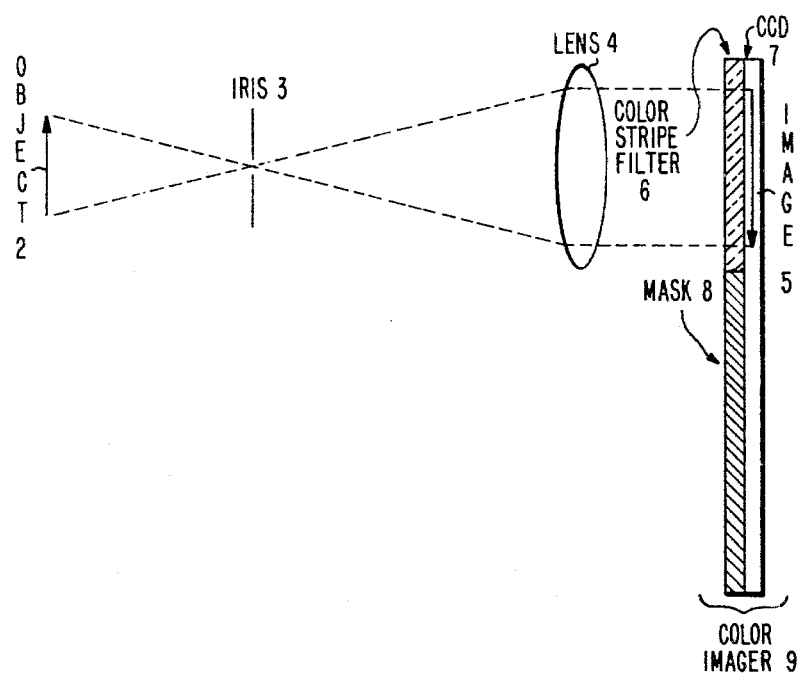
FIG. 1 is a schematic showing the optical path of a color television camera embodying the present invention.

As shown in FIG. 1, the color camera system admits light from an object 2, typically via an iris 3 which can be adjusted to increase the range of average light levels the camera can accommodate. This light is collimated by a lens system (shown for sake of simplicity as a single lens 4, rather than the more complex lens assembly conventionally used), for projection of a real image 5 through a color stripe filter 6 into a portion of a vertical-frame-transfer charge-coupled-device (or CCD) 7 associated with its "A" register. A mask 8 prevents light from falling on other portions of the CCD 7 associated with its "B" and "C" registers. The "A," "B," and "C" registers will be defined and described in the description, following, of FIG. 2. The color stripe filter 6 is, by way of example, assumed to be one having color stripes vertically aligned with the page, assuming the direction of rapid scan of the display to be horizontal—i.e., into and out of the page. These stripes are assumed to be cyclically red, green, and blue primary colors insofar as the color they pass, being subtractive color filters. Elements 6, 7 and 8 comprise a "color imager" 9.

Figure 2:
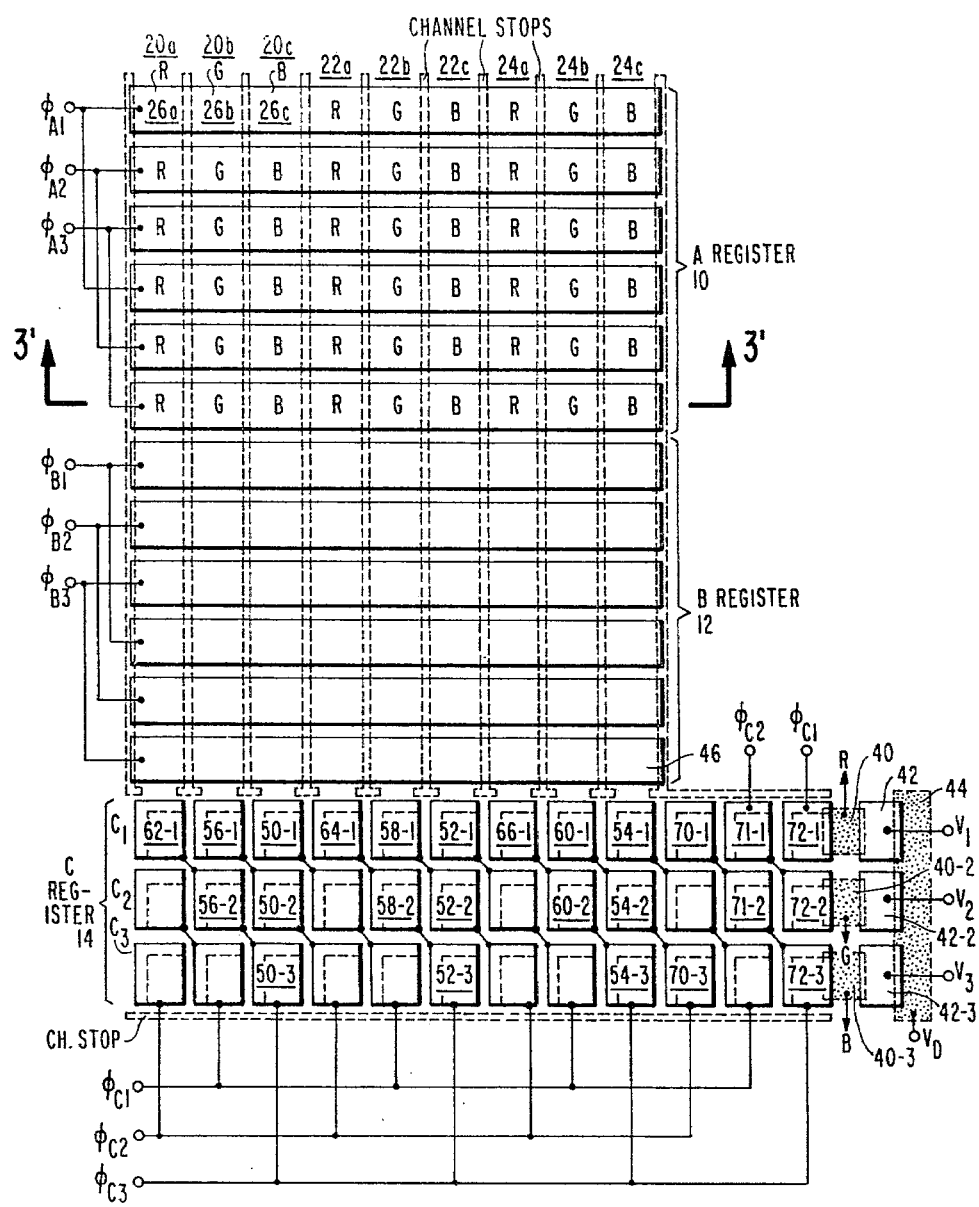
FIG. 2 is a plan view of a vertical-frame-transfer CCD device therein looking at the front side thereof.

The color imager of FIG. 2 is of a type described in detail by Paul Kessler Weimer in U.S. Pat. No. 4,001,878 issued Jan. 4, 1977, entitled "Charge Transfer Color Imagers," and assigned to RCA Corporation. The invention is described in connection with this type of imager by way of illustration only, since a drawing figure illustrating this type of imager is readily available; and the invention is useful with other forms of CCD imagers, such as those of the line-transfer type and those of the interline-transfer type, and is generally useful with charge-imaging devices. The whole of U.S. Pat. No. 4,001,878, is incorporated herein by reference, with the parts of its specification of particular significance to the present invention quoted directly hereinafter, with editorial additions indicated by inclusion between brackets and editorial deletions indicated by ellipsis.

"The color imager . . . includes a photosensing array 10, hereafter termed an A register, a temporary storage array 12, hereafter termed a B register, and an output register 14, hereafter termed a C register. The scene being viewed is projected onto the A register 10 . . . . The B and C registers are masked, that is, means are provided for preventing a radiant energy image from reaching either register.

"The A and B registers have channel stops extending in the column direction to isolate the channels (the columns of the CCD) from one another. The electrodes, shown schematically, may be any one of the usual single layer polysilicon construction or overlapped polysilicon or polysilicon overlapped by metal construction, or any other of the known three phase type of electrode structures. For purposes of illustration, the single layer polysilicon electrode structure is illustrated. It may comprise, for example, highly doped regions which form the conductors, separated by intrinsic regions which form the insulation between adjacent electrodes. The imager, while illustrated to be three-phase operated, may of course be two-phase-operated (provided appropriate electrodes are employed to insure unidirectional signal propagated) or four or higher phase operated . . . .

"[The] A register 10 includes filters of different colors over the different columns, respectively, in each group of three columns. Thus, all of the a columns are formed with a red filter through which an image is projected onto the array; all of the b columns are formed with a corresponding green filter, and all of the c columns are formed with a corresponding blue filter. For purposes of illustration, only nine columns are illustrated and they are divided into three groups 20, 22 and 24, each group, such as 20, containing three columns such as 20a, 20b, and 20c. The width of a single resolution element is equal to the portions of a row conductor over three adjacent columns such as portions 26a, 26b, and 26c. (An entire resolution element may be considered to comprise the area covered by three columns and three rows as explained later). Each portion, such as 26a, of a conductor operates as a single electrode and is hereafter termed an electrode.

"The filter itself is illustrated only schematically by the capital letters R, G, and B. Each filter may be a multilayer interference filter or simply a dyed absorption type filter, formed of plastic for example, both types of filters in themselves being well known. The filter strips are located over the image receiving surface of the A register. For example, in the case of a rear surface illuminated imager, they would be located on the rear surface of the substrate.

"The C register comprises three sections, $C_1$, $C_2$, and $C_3$. The $C_1$ section is immediately adjacent to the B register. Each electrode of the $C_1$ section is aligned with a different channel of the B register . . . insulated from the substrate . . . by a thin silicon dioxide ($SiO_2$) insulating layer . . . . There is formed in the substrate beneath the left edge of each electrode an ion implanted region . . . of the same conductivity type as the substrate but of higher impurity concentration than the substrate. A similar ion implanted region . . . is located beneath the upper edge of each electrode . . . . The purpose of these regions is to cause a shallower depletion region to form than beneath the remaining portion of the electrode in response to a positive voltage applied to the electrode and in this way to insure unidirectional signal propagation . . . .

"The output portion of the C register is conventional. Each section includes a floating diffusion such as 40 of opposite conductivity than the substrate and a reset electrode such as 42. There is also a drain diffusion 44 of opposite conductivity type than the substrate and which may be common to the three C register sections. Each control electrode such as 42 may overlap the floating diffusion and the drain diffusion. The drain diffusion may be held at a fixed potential $V_D$ which would be positive in the case of a surface channel CCD with P type substrate where the charge carriers are electrons.

"In the operation of the system of FIG. . . . [2] during the so called integration time, a scene or other image is projected onto the A register. The light causes charges to be produced at various location of the A register in accordance with the light intensity, and its color, reaching the respective locations. The color filters [are to] insure that the different color components will be stored in different columns of each three column group.

"Upon the completion of the integration time (during the vertical blanking interval of commercial television), the charge signals which have accumulated (a "field") are transferred, in parallel, in the column direction from the A to the B register by the application of the multiple phase voltages $\phi_{A1}$, $\phi_{A2}$, $\phi_{A3}$ and $\phi_{B1}$, $\phi_{B2}$ and $\phi_{B3}$. During this time, the $\phi_A$ and $\phi_B$ voltages are at the same frequency and in synchronism. Thereafter, the $\phi_A$ voltages are applied in a sense to permit integration of a new field . . . .

"Concurrently with the integration being performed in the A register, the $\phi_B$ multiple phase voltages are applied to the B register for transferring the charge signals temporarily stored in the B register to the C register. The transfer takes place one third of a line at a time (during the horizontal retrace line of commercial television) in the following way. Assume that a line of information is present beneath electrodes 46 of the last row. This means that $\phi_{B3}$ is relatively positive. Assume that at the same time $\phi_{C1}$ is relatively positive. The transfer of a line from the B to the $\phi_C$ register takes place at very high speed, all three phases of the $\phi_C$ multiple phase voltages occurring while $\phi_{B3}$ is high. When $\phi_{C1}$ is high, it places electrodes 50-1, 52-1 and 54-1 at this same level and charge signals present in columns 20c, 22c and 24c transfer to beneath electrodes 50-1, 52-1 and 54-1 respectively. Thus, one third of a word—the third containing information as to the blue (B) color component of the image, has been transferred from row 46 to register section $C_1$. $\phi_{C1}$ may be sufficiently more positive than $\phi_{B3}$ to insure complete or substantially complete charge transfer.

"Next $\phi_{C2}$ goes high while $\phi_{C1}$ goes low. This causes the charge signals present beneath electrodes 50-1, 52-1 and 54-1 to transfer beneath electrodes 50-2, 52-2 and 54-2. The ion implanted regions beneath the upper edges of the electrodes 50-1, 52-1 and 54-1 insure unidirectional propagation (in the down direction) of the charge signals. That is, as the voltage on an electrode such as 50-1 is becoming less positive and the voltage on an electrode such as 50-2 is becoming more positive, the charge preferentially flows to beneath electrode 50-2 rather than back to beneath electrode 46 even though the latter is still at a relatively high (positive) level. The ion implanted region beneath the left edge of an electrode such as 50-1 and its absence at the lower edge of electrode 50-1 causes the charge beneath electrode 50-1 to flow preferentially downward to electrode 50-2 rather than to electrode 56-1.

"At the same time that one third of a word is being transferred from the $C_1$ to the $C_2$ register section, another third of a word is being transferred from electrode 46 to the $C_1$ register section. Thus, charge present in channel 20b transfers to beneath electrode 56-1; charge present in channel 22b transfers to beneath electrode 58-1; and charge present in channel 24b transfers to beneath electrode 60-1. This third of the word contains information as to the green (G) color component of the image.

"Next $\phi_{C3}$ goes high while $\phi_{C2}$ goes low. It can be shown that in a manner similar to that discussed above, the first third of a word now transfers to beneath electrodes 50-3, 52-3 and 54-3 in the $C_3$ register section. At the same time, the second third of a word transfers to register section $C_2$ beneath electrodes 56-2, 58-2 and 60-2. Finally, the last third of the word, this one containing information as to the red (R) color component, transfers from channels 20a, 22a and 24a to beneath electrodes 62-1, 64-1 and 66-1 respectively. Thus, the C register now stores all of the color information formerly in row 46. Section $C_1$ stores the red color information; section $C_2$ stores the green color information and section $C_3$ stores the blue color information.

"The readout of the C register now begins. The readout must take place, that is, the C register must be emptied, during the time interval before the next row of information is shifted into the last row 46, and the frequency of the $\phi_C$ voltages is adjusted accordingly. In terms of commercial television, this readout takes place during the horizontal line time. Further, in the embodiment illustrated, during readout the order of the multiple phase voltages is changed, that is, they occur in the order $\phi_{C3}, \phi_{C2}, \phi_{C1}$.

"The readout of the C register is accomplished in the following way. Assume that the last third of the row of charge signals is present in register $C_1$ and $\phi_{C3}$ is high. A blue color signal is present beneath electrode 54-3 the one in section $C_3$ aligned with channel 24c. Now $\phi_{C2}$ goes high while $\phi_{C3}$ goes low. This causes charge to transfer one place to the right in all C register section. Thus, the blue (B) component beneath electrode 54-3 transfers to beneath electrode 70-3; the green (G) component beneath electrode 60-2 transfers to beneath electrode 54-2; and the red (R) component beneath electrode 66-1 transfers to beneath electrode 60-1. The implanted regions beneath the upper edges of the various electrodes driven by $\phi_{C3}$, which is becoming less positive while $\phi_{C2}$ is becoming more positive, prevents any upward transfer of charge. This process continues, until when $\phi_{C3}$ goes high again, all charge signals in the C register have transferred three electrodes to the right, with the first blue color signal (that formerly present in column 24c) present beneath electrode 72-3. This signal passes to the floating diffusion 40-3 to which the output lead legended B is connected. Therefore, the blue color signal which came from channel 24c is available as an output signal. This output signal may be applied to an output amplifier (not shown) and then to a utilization circuit (not shown). After this output signal passes to the amplifier, control signal $V_3$ is made positive to reset the floating diffusion 40-3 to the approximate potential of the drain region 44, in conventional fashion.

"After $\phi_{C3}$ has gone high, $\phi_{C2}$ goes high and $\phi_{C3}$ goes low. This shifts the contents of all C register sections one increment to the right. In particular, the green color signal derived from channel 24b which was stored beneath electrode 71-2 of the $C_2$ register section shifts to beneath electrode 72-2 and from there to the output diffusion 40-2. As in the previous case, the output signal thereby obtained may be amplified and sent to a utilization circuit and thereafter the control voltage $V_2$ goes high to reset the floating diffusion 40-2 to the drain 44 potential.

"Next $\phi_{C1}$ goes high and $\phi_{C2}$ goes low. Again this shifts the contents of the C register one additional place to the right. Just prior to $\phi_{C1}$ going high, electrode 71-1 was storing the red color signal from channel 24a. When $\phi_{C1}$ goes high and $\phi_{C2}$ low, this charge signal moved to beneath electrode 72-1 and then to floating diffusion 40. Again this output signal may be amplified and applied to the utilization circuit and then $V_1$ is turned on to reset the floating diffusion 40 to the drain potential. In each of the cases above, after the floating diffusion is reset, the control voltage ($V_1$ or $V_2$ or $V_3$) is returned to its quiescent, relatively less positive level.

"The operation just discussed has shown how the red, green and blue signals in one resolution element—the right-most such element 24, has been read out of the last row of the register. By continuing the $\phi_C$ multiple phase voltages, the succeeding resolution elements in the row are read out. The color components of each resolution elements, in this embodiment, are read out sequentially, first the blue, then the green and then the red color component. However, if desired, all three components of each element may be read out concurrently. This may be done, for example, by temporarily storing the blue component for two thirds of a period of $\phi_C$, temporarily storing the green component for one third of the period of $\phi_C$, and then, when the red color component arrives during the next third of the period of $\phi_C$, clocking out the three color components concurrently. The storage can take place externally of the C register, for example on three separate storage capacitors or, with appropriate circuit design and timing, may take place in the floating diffusions themselves. In the later mode of operation, the gate electrode 42, 42-2 and 42-3 may consist of a single structure which is controlled by a single control voltage after the simultaneous readout of the red, green and blue components.

"There is also a third construction and mode of operation possible for obtaining concurrent blue, green and red color signals. It is to position the three floating diffusions in staggered fashion, that is, for example, roughly in the positions now occupied by electrodes such as 70-1, 71-2 and 72-3, respectively. This permits a common control electrode (instead of the three shown at 42, 41-2 and 42-3) to be used for reset purposes. Now, in operation, when $\phi_{C1}$ goes positive, all three color signals concurrently pass to the three floating diffusions to produce the three output signals of the C register concurrently. Thereafter all three diffusions may be reset to the drain 44 potential by applying a control voltage to the common control electrode.

"While for purposes for the present explanation, the C register has been illustrated by a particular kind of register, other forms of C registers may be used instead. As an example, the three section register and gating electrode structure illustrated in FIG. 8 of copending U.S. application Ser. No. 534,829, filed Nov. 19, 1974 by Walter F. Kosonocky for Charge Coupled Device Imager, now U.S. Pat. No. 3,971,003, and assigned to the same assignee as the present application, may be used instead. Alternatively, other forms of C register which includes a first section for receiving 1/N'th of a word at a time from the B register and N-1 of other register sections, each for temporary storing 1/N'th of the word shifted to it from the first register section, with appropriate gating structures for shifting the partial rows to the C register and appropriate control circuits for reading out the C register, may be used.

"[As] . . . discussed so far, the three color components for each resolution element are read out before the three color components for the following resolution element. Thus, in the examples given by way of illustration, first the three color components for a resolution element in the group of columns 24 is read out, then the three color components for a resolution element in the columns 22 are read out, then the three color components for resolution element in the columns 20 are read out. It is also possible to operate the imager in 'field-sequential' fashion. Here, the output structure may be simpler than shown and may comprise, for example, only a single section, such as $C_1$, output register. In this embodiment, first one of the color components is read out in its entirety from a row, then the next color component, and then the third color component. For example, in response to $\phi_{C1}$ the one third of a word containing the blue color component is read out from the B register into the $C_1$ register. Then that one third of a word is read out of the $C_1$ register, in its entirety, and employed, for example, for supplying the blue color signal for a row which is to be displayed on a screen of a kinescope. Thereafter, in response to $\phi_{C2}$, the second third of a word, this one containing the green color component of the signal, may be read into the $C_1$ register and then read out in its entirety, from the $C_1$ register. This second third of a word may be employed for supplying the screen color component for a row displayed on a kinescope. In similar fashion, the last third of the word, this one containing a red color component, may be transferred to the $C_1$ register and read out in its entirety from the $C_1$ register. In this form of color system, as is well understood in the art, the eye is depended upon to integrate the three different colors produced during three successive thirds of a line time".

FIG. 3 is a cross-section through the A register portion of the FIG. 2 CCD imager, adjoined by a doping profile, which composite figure is useful in understanding a phenomenon which, however, undesirably introduces some crosstalk of the red information into the blue and green information, of the green information into the red and blue information, and of the blue information into the green and red information. This phenomenon, which introduces up to 20% crosstalk, depending on the widths of the columns in the A register, will be referred to as "electronic material crosstalk" or "EMCT" and is caused by diffusion of a part of the generated carriers from one of the columns of the A register to an adjoining column prior to its collection. This type of diffusion is referred to as "sideways" diffusion.

Depletion regions 80, 81, 82, 83, 84, 85, 86, 87, 88 are induced in the surface of an epitaxial semiconductor region 90 adjoining dielectric layer 91, owing to electrostatic induction creating a depletion region opposite an electrode 92 disposed on the surface of the dielectric layer 91 remote from epitaxial region 90, when the potential applied to the electrode 92 differs from the potential maintained by conventional means in the semiconductor region 90 at a plane remote from the interface with layer 90. The limits to which regions 80–88 extend into epitaxy 90 are defined by dashed lines. The depletion region is divided by the channel stop diffusions in the surface of epitaxial region 90, shown black in the FIG. 3 and FIG. 4 cross-sections. Although not shown in any of FIGS. 2–4, it should be understood that (per conventional practice) semiconductor region 90 is contacted through one of its surfaces and biased to a background potential against which the potentials at the imager electrodes are referred.

The generation of the charge carriers—i.e., electrons or holes—collected as charge in these potential wells is in response to photons interacting with the semiconductor lattice and can take place at an appreciable distance y from the surface of the semiconductor adjoining the dielectric layer 91. These photons enter the epitaxial region 90 owing to front surface illumination in FIG. 3. The potential wells associated with depletion regions 80–88 extend into the epitaxial region 90 and provide electrostatic field to accelerate charge carriers in a direction normal to the interface between epitaxial region 90 and dielectric layer 91. But the strength of these electrostatic fields is so much attenuated at distance y that the normal diffusion of the charge carriers, which tends to be in all directions, predominates, so the charge carriers will exhibit sideways diffusion which will place them in wrong columns of the A register.

The invention reposes in controlling the concentration of doping in the epitaxial layer 90 as it is grown to create an additional drift field to provide a pronounced accelerating field towards the dielectric layer 91, even at distances remote from the electrodes and thus direct charge carriers towards the potential wells. That is, charge carriers are impelled in a direction normal to the surface of epitaxial region 90 adjoining dielectric layer 91. Impurity concentration will decrease towards this surface as shown in the graph at right of FIG. 3.

The techniques for varying doping concentration in epitaxial growth from vapor phase are well understood by those of normal skill in the art. E.g., the epitaxial growth on a p-type or n-type silicon substrate can be conducted in a silane atmosphere decreasing the concentration of impurities, boron or phosphorus, respectively, within the $10^{14}$ to $10^{16}$ atoms/cm$^3$ range as the thickness of the epitaxial layer increases. Or one can use a highly doped substrate and grow the epitaxial layer in a non-doped atmosphere, relying on out-diffusion from the substrate into the epitaxial layer to establish the desired concentration gradient. These techniques for establishing the concentration gradient in the semiconductive material of the imager are illustrative of construction and are not to be construed as limiting the scope of the claims. In fact, the concentration gradient can be established by techniques other than epitaxial growth—e.g., high-energy ion implantation. The mean doping concentrations of the semiconductive material is, per se, not of concern to the invention. It is the gradient of the doping concentration which establishes an internal drift field in the semiconductive material in furtherance of the invention which is the focus of concern. The concentration gradient needed to provide an adequate drift field can be derived by the following analysis.

The time $t_1$ required to transport charge carriers from their generation site to the potential well which should collect them (i.e., the one through which a perpendicular to the surface between epitaxial region 90 and dielectric layer 91 that passes through the generation site will also pass) can be adequately approximated using the following formula, where $\mu$ is charge carrier mobility and E is the electric field intensity, which formula neglects second-order electric field effects.

$$t_1 = y/\mu E \tag{1}$$

The time $t_2$ required to diffuse charge carriers sideways over the distance d (the channel stop width) can be adequately approximated using the one-dimensional diffusion equation following.

$$t_2 = d^2/D \tag{2}$$

Equation 3 defines diffusion constant D.

$$D = (kT/q)\mu \tag{3}$$

The k term is Boltzmann's constant, T is absolute temperature, and q is the unit electron charge.

When $t_2$ is much, much longer than $t_1$, EMCT will be minimized, which places the following requirement on E.

$$E >> (y/d^2)(kT/q) \tag{4}$$

Assuming y to be $10^{-3}$ cm., the typical absorbtion length for red illumination of a front-surface illuminated imager, or the typical thickness of a back-surface illuminated imager which is poorly penetrated by blue light; d to be $10^{-3}$ cm; and kT to be $25 \cdot 10^{-3}$ electron volts (for room temperature) the E field required substantially exceeds 25 V/cm.

If the impurity concentration changes from $N_1$ to $N_2$ over the distance $\theta$, which is the thickness of the epitaxial layer, the electric field E associated with this change can be expressed as follows.

$$E = (kT/q\phi)\ln(N_1/N_2) \tag{5}$$

Supposing the E field defined by equation 4, required to minimize EMCT, to be provided by change in impurity concentration in the epitaxial layer, equation 4 can be substituted into equation 5 to arrive at the following formula for the change in impurity concentration required in the epitaxial layer.

$$\ln(N_1/N_2) >> y\theta/d^2 \tag{6}$$

Assuming an epitaxial layer thickness $\theta$ of $10^{-3}$ cm—i.e. 10 $\mu$m or microns—a decrease in doping concentration much larger than 2.3 times over the $10^{-3}$ cm epitaxial growth is required. With present epitaxial growth technology the required concentration gradients can easily be achieved over $10^{-3}$ cm of epitaxial growth without difficulty.

FIG. 4 shows the cross section of a CCD imager like that in FIG. 3 except that the substrate 94 on which the epitaxial layer 90 was grown has been etched away to permit back surface illumination of the imager. The concentration gradient in the remaining portion 90' of the epitaxial layer remains unchanged, as shown in FIG. 3.

The description thusfar has been of surface-channel type CCD images where the region of semiconductive material along a surface of which region potential wells are induced has an internal drift field towards that surface, created by increasing the concentration of impurities in that region with increasing distance from that surface. A possible alternative for creating the drift field is to diffuse impurities of opposite doping type into the region of semiconductive material through the surface along which potential wells are induced, with the concentration of those impurities decreasing with increasing distance from that surface, but this type of processing is harder to control than the types of processing described above. The invention is also applicable to buri-channel type CCD imagers, the internal drift field being created in the region of semiconductive material in which charge carriers are generated.

The subtractive color filter 90 of FIG. 1 can be provided by organic dyes deposited directly on the CCD as presently done in the art. In higher-quality cameras dichroic filters can be used to cut light loss during filtering. To obtain highest transparency to passed light such dichroic filters may pass yellow, green and cyan; the output signals from the C register are then linearly combined in a matrix to obtain the desired output color signals.

It will be apparent to one skilled in the art and armed with the foregoing disclosure that the invention is applicable to CCD imagers using different arrangements from that described for shifting charge from the photosensing array. The invention is applicable, for example, to infrared imagers of the line transfer type. The invention is also applicable to charge-imaging semiconductor devices where the charge collection is effected by x-y addressing methods rather than by CCD methods. The invention prevents unwanted migration of charge between potential wells under integrating electrodes in a wide variety of semiconductor imagers; and the following claims should be construed bearing this in mind.

What is claimed is:

1. In a charge-coupled-device imager system having:
  an optical lens system for projecting a light image in a plane;
  a color discriminating optical filter, included in said optical system, for causing said projected light image to be projected in a prescribed pattern of separated colors;
  a charge-coupled-device including a region of semiconductive material arranged so said light image is projected thereinto for generating charge carriers at sites therein, said region of semiconductive material having a plane surface normal to the direction of projection of said light image into said region of semiconductive material including a dielectric layer having a first surface at the plane surface of said region of semiconductive material and having a second surface opposing its first surface, and including means inducing potential wells in said region of semiconductive material adjacent to its plane surface, for collecting charge carriers generated in their respective vicinities and integrating the collected charge carriers to form respective charge signals, which means includes electrodes disposed on the second surface of said dielectric layer; and means for recurrently sampling in prescribed temporal order the charge signals from selected ones of said potential wells to generate color video signals—the improvement wherein said region of semiconductive material is of a type having an internal drift field for accelerating the diffusion of said charge carriers through said semiconductive material in a direction towards said plane surface to substantially reduce the likelihood of any of them being collected in a potential well other than the closest one to its respective generation site in said region of semiconductive material.

2. A semiconductor imager comprising:

a semiconductor region having a front and a back surface, receptive of an image projected through one of its surfaces;

means for inducing potential wells in the front surface of said semiconductor region; and an impurity concentration gradient in said semiconductor region between said front and back surfaces providing a built-in electric field gradient for accelerating the charge carriers created in response to the image projected onto its image receiving surface, and directing the charge carriers from the charge generation sites to said potential wells along paths predominantly normal to said front surface.

3. A semiconductor imager as set forth in claim 2 wherein the semiconductor region is of one conductivity type and said impurities are of the same conductivity type.

4. A semiconductor imager comprising:

a region of semiconductive material having opposing first and second surfaces, through one of which surfaces a radiant energy image is received to generate charge carriers within said region, and having an impurity concentration gradient between said first and second surfaces which establishes an internal electric field gradient within said region for tending to direct the charge carriers thus generated towards said first surface;

means for collecting the charge carriers directed to each of specific areas of said first surface to form a respective charge signal associated with that specific area; and means for recurrently sampling said charge signals in a prescribed temporal order to generate a video electric signal descriptive of said radiant energy image.

5. A semiconductor imager including:

a region of semiconductive material having opposing first and second surfaces, through one of which surfaces a radiant energy image is received to generate charge carriers within that region;

means for generating within said region of semiconductor material an electric field gradient tending continuously to direct the charge carriers generated in response to said radiant energy image towards said first surface in a direction perpendicular to said first surface;

a dielectric layer disposed on said first surface; and electrodes disposed on said dielectric layer opposite the first surface of said region for inducing potential wells in which charge carriers are collected.

6. A semiconductor imager including:

a region of semiconductive material having opposing first and second surfaces, through one of which surfaces a radiant energy image is received to generate charge carriers within that region, and having an impurity concentration gradient between said first and second surfaces which establishes an internal electric field gradient within that region for tending to direct the charge carriers thus generated towards said first plane surface;

a dielectric layer disposed on said first surface; and electrodes disposed on said dielectric layer opposite the first surface of said region for inducing potential wells in which charge carriers are collected.

7. A semiconductor imager as set forth in claim 4, 5 or 6 of a type suited for projection of a radiant energy image through the first surface of said region of semiconductive material in combination with:

means for projecting a radiant energy image through that first surface.

8. A semiconductor image as set forth in claim 4, 5, or 6 of a type suited for projection of a radiant energy image through the second surface of said region of semiconductive material in combination with:

means for projecting a radiant energy image through that second surface.

9. A semiconductor imager as set forth in claim 2, 4, 5, or 6 having:

means for conditioning said semiconductor imager to operate as a charge-coupled-device imager.

* * * * *